United States Patent [19]

Ota

[11] Patent Number: 5,173,762
[45] Date of Patent: Dec. 22, 1992

[54] SEMICONDUCTOR DEVICE USING BONDING WIRES OF DIFFERENT MATERIALS

[75] Inventor: Masaki Ota, Hyogo, Japan

[73] Assignee: Kabushiki Kaisha Toshiba, Kawasaki, Japan

[21] Appl. No.: 668,024

[22] Filed: Mar. 12, 1991

[30] Foreign Application Priority Data

Mar. 15, 1990 [JP] Japan .................................. 2-62789

[51] Int. Cl.$^5$ .................. H01L 29/46; H01L 29/54; H01L 29/62
[52] U.S. Cl. .................................. 257/666; 257/784; 257/741
[58] Field of Search ............................. 357/65, 68, 70

[56] References Cited

U.S. PATENT DOCUMENTS 4,845,543  7/1989  Okikawa et al. ...................... 357/67
5,070,041  12/1991  Katayama et al. .................. 437/214
5,093,712  3/1992  Matsunaga et al. .................. 357/72

Primary Examiner—Frank Gonzalez
Attorney, Agent, or Firm—Foley & Lardner

[57] ABSTRACT

Disclosed is a semiconductor device comprising a semiconductor integrated chip having at least a power processing circuit in which a larger current flows and a signal processing circuit in which a smaller current flows, each circuit having bonding pads, a package having leadframes, on which the semiconductor integrated chip is mounted, and a plurality of bonding wires with different materials through which the bonding pads are joined to the leadframes.

8 Claims, 1 Drawing Sheet

SEMICONDUCTOR DEVICE USING BONDING WIRES OF DIFFERENT MATERIALS

BACKGROUND OF THE INVENTION

1. Field of the Invention

This invention relates to a semiconductor device including semiconductor integrated chips mounted on a package, such as a ceramic package or a plastic package, more particularly to a semiconductor device in which electrodes of the semiconductor integrated chips such as a power processing circuit (a power MOS FET), a signal processing circuit etc. are joined to leadframes of the package through a plurality of bonding wires of different materials, for example Au (Gold) wires and Aluminum (Al) wires.

2. Description of the Prior Art

Recently LSI (Large Scale Integration) or VLSI (Very-Large Scale Integration) devices mounted on one chip, as semiconductor devices, have been fabricated. Each device comprises a semiconductor integrated circuit with a power element as a power processing circuit capable of handling large amounts of electrical power and a signal processing circuit for processing signals (digital/analog) dissipating a relatively small current. These devices are used for applying to an automobile switch (called by "IPD").

In such semiconductor devices, the electrical power portion of the chip (as the power processing circuit) for handling approximately several ampere current or more consists of the power MOSFETs or power bipolar transistors, or other semiconductor devices.

Accordingly, in the prior art, a multi-point wire bonding method is used for wiring multi-point bonding wires to the electrical power portion, to supply electrical power to the outside of the chip, by which a leadframe of the chip is connected to a bonding pad as an electrode of the electrical power portion.

As an example of the multi-point bonding wires formed by the multi-point bonding method in the prior art, for example, there is a following case.

FIG. 1 is a schematic diagram showing a bonding pad as a multi-point bonding portion and bonding pads in a signal processing portion (as the signal processing circuit) in the semiconductor device.

In the same diagram, the power processing portion 2b and the signal processing portion 2a are formed on a chip 2 mounted on a die pad 1 in a package (not shown).

The bonding pads 3a in the signal processing portion 2a, in which small current flows, are joined to inner lead portions 4 (as leadframes of the package) through bonding wires 5 of Au (Gold) or Cu (Copper) wires of approximately 25 to 50 μm in diameter which are commonly used.

While, in the power processing portion 2b or a power portion in the chip 2, the bonding pad 3b is joined to the inner lead portion 8 using the three bonding wires 6 whose diameters are each as large as the bonding wires 5 used in the signal processing portion 2a.

Thus, in the prior art, plural bonding wires must be required per pad to carry the larger current in the power processing portion 2b. When only one bonding wire is used per bonding pad in the power processing portion 2b, the bonding wire cannot carry the amount of large current, for example several amperes.

On the other hand, there are several disadvantages in the multi-point wire bonding method.

For example, the number of the bonding wires needed to bond the inner lead portion 8 are limited by the size of a capillary which leads the bonding wires 6 to a target portion (in such a case, it is the bonding pad 3b) for bonding, the area of inner lead, and others.

When a bonding wire of 50 μm in diameter is used for bonding in the bonding pad of $1 \times 3$ mm$^2$ in area, the maximum number of the bonding wires is three or four. Accordingly, the current intensity taken out from the power portion 3b is limited by the number of the bonding wires provided at the bonding pad 3b. Thus, the ability of the power portion 2b is limited and reduced by the number of the bonding wires.

Moreover, in the multi-point bonding method, the bonding wires are integrated in a small area, such as the bonding pad 3b and the leadframe 8, for bonding so that these are short-circuited to each other, then the large short current flows, so as to weld these bonding wires.

Furthermore, the current intensity taken from the power processing portion 2b, or the balance of the power consumption in the power processing portion 2b, are changed by the difference of the portion joined with the bonding wires 6 in the power processing portion 2b or of the interval between the bonding wires 6 so that the power processing portion 2b cannot adequately exhibit its ability.

In the prior art, the multi-point bonding method is commonly used for the bonding of the semiconductor device, including the integrated circuit capable of handling large electrical power and the integrated circuit for processing signals having small current.

Consequently, the power processing circuit cannot exhibit its ability, so that the reliability of the semiconductor device is reduced.

SUMMARY OF THE INVENTION

An object of the present invention is to solve the problem in the prior art, as described above, and to provide a semiconductor device having a high reliability including a power processing circuit and a signal processing circuit with the plurality of bonding wires of different materials.

To achieve the object, a semiconductor device according to the present invention comprises a semiconductor integrated chip having at least a power processing circuit and a signal processing circuit each having bonding pads, a package having leadframes on which the semiconductor integrated chip is mounted, and a plurality of bonding wires of different materials, through which the bonding pads are joined to the leadframes.

In the semiconductor device having the above construction, bonding wires having larger diameters, and an Aluminum (Al) or an Al alloy are used in the power processing circuit for bonding the bonding pads to the leadframes. Thereby, the semiconductor device can exhibit its true performance. Moreover, productivity of the semiconductor device can be increased because the failure rate is reduced.

These and other objects, features and advantages of the present invention will be more apparent from the following description of a preferred embodiment, taken in conjunction with the accompanying drawing.

DETAILED DESCRIPTION OF THE EMBODIMENTS

Hereinafter, an embodiment of the present invention will be described with reference to the attached drawings.

Figure 1:
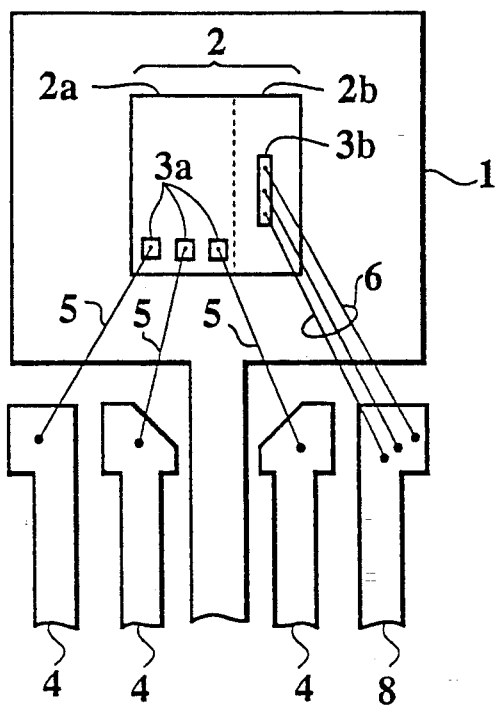
FIG. 1 is a schematic diagram showing a bonding pad as a multi-point bonding portion formed by the multi-point bonding method and bonding pads in a signal processing portion in a semiconductor device according to the prior art.
Figure 2:
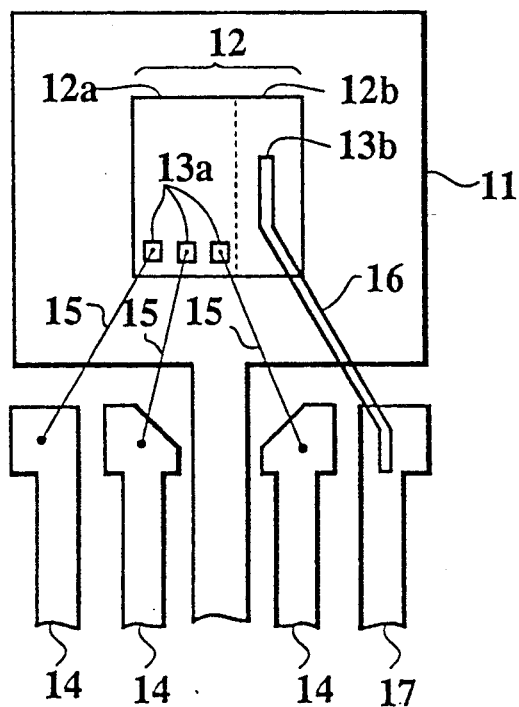
FIG. 2 shows a schematic diagram of a semiconductor device according to the present invention in which a bonding pad as an electrode for the power processing portion is joined to a leadframe of a package by one bonding wire whose material is Al or an Al alloy.

FIG. 2 shows a schematic diagram of a semiconductor device according to the embodiment in which a semiconductor chip 12 is formed on a die pad 11 mounted on a package (not shown), such as a ceramic or plastic package having leadframes. The semiconductor chip 12 comprises a signal processing portion 12a made up of bipolar transistors and a power processing portion 12b consisting of a power MOS FET.

In the signal processing portion 12a, each bonding pad 13a is joined to an inner lead 14 of the leadframe of the package through a bonding wire 15 of approximately 38 μm in diameter, formed of an Au wire. The Au wire has low electrical resistance.

While, the power processing portion 12b comprises the power MOS FET whose voltage limit between the source and the drain is more than sixty (60) voltages, whose current is approximately four (4) amperes, and whose ON-resistance is approximately 0.22 Ω. The bonding pad 13b as an output electrode of the power MOS FET is joined to the inner lead 17 as the leadframe of the package through the bonding wire 16 whose material is an aluminum (Al) wire or an Al alloy wire. The Al wire has low electrical resistance, and is approximately 100-400 μm in diameter.

The bonding wires in the signal processing portion 12a are formed using the Ball bonding method (Nail head bonding method), which is commonly used. The power processing portion 12b is formed by ultrasonic bonding, so as to form the bonding wire 16 having a relatively larger diameter. This bonding method is widely used to join the bonding pads and the inner leads to the leadframes through the bonding wires 15 and 16.

Moreover, in the present invention, because an apparatus for fabricating the wire bondings of the signal processing portion 12a and the power processing portion 12b (in which the Ball bonding method and the Ultrasonic bonding method are used together), are integrated into one apparatus, these wire bonding processes can be carried out without decreasing productivity.

The bonding wire 16 having the construction described above can continuously carry a relatively large current in the power MOS FET. When the maximum output current of the power MOS FET as the power processing portion 12b is approximately eight (8) amperes being twice as large as its continuous output current, one bonding wire 16 of approximately 250 μm in diameter can be used per bonding pad in the power processing portion 12b for the maximum output current.

On the other hand, in the prior art, the bonding wire of approximately 50 μm in diameter conventionally used can continuously flow only two or three amperes and has a maximum output current of approximately six (6) amperes. In this case, at least more than three bonding wires are required for the bonding pad in the power MOS FET, as described in the description of the prior art.

Comparing the present invention and the prior art about the area of the bonding pad for connecting the bonding wire in the power processing portion, the area for connecting the bonding wire of the present invention is smaller than that of the prior art. Therefore the size of the semiconductor device can be reduced.

Moreover, since one pad is joined to one bonding wire in the present invention, poor bonding wires are not used, so that the reliability of the semiconductor device can be increased.

Furthermore, in the prior art, unbalance of the output electrical current caused by the difference of the length of the bonding wires joined to the bonding pad or of the connecting portions of the bonding wires in the power processing portion as the power MOS FET is generated, and unbalance of electric power consumption caused by the difference between the areas of the power processing portion and the signal processing portion is occurred, but they are not generated in the present invention because one bonding wire having larger diameter is joined to one bonding pad in the power processing portion. Accordingly, the reliability of the semiconductor device can be increased.

In addition, in the semiconductor device of the present invention, the Al wire as the bonding wire is used for the bonding pad in the power processing portion so that the Al bonding wire having a larger diameter can be joined to the bonding pad without damage of the power MOS FET chip 12b as compared to the Au bonding wires used for the bonding pad 3b in the power processing portion 2b in the prior art.

Moreover, as the Al bonding wire is cheaper than the Au bonding wire, the productivity cost of the semiconductor device according to the present invention can be reduced.

This invention is not limited to the foregoing embodiment. In particular, it is possible to apply the construction of the embodiment to a chip of an integrated circuit in which bonding pads for a small amount of current and a bonding pads for a large amount of current are incorporated.

Furthermore, for example, Copper (Cu), Silver (Ag), and Palladium (Pd), rather than Au, can be used for the bonding wire in the signal processing portion 12a. An aluminium alloy can also be used for the bonding wire in the power processing portion as the power MOS FET.

What is claimed is:

1. A semiconductor device comprising:
   a semiconductor integrated chip having at least a power processing circuit and a signal processing circuit, each circuit having bonding pads;
   a package having leadframes on which the semiconductor integrated chip is mounted; and
   a plurality of bonding wires with different materials through which the bonding pads are joined to the leadframes,
   wherein
   the bonding wires used for the power processing portion each consist of a metal wire of a first metal through which the bonding pad in the power processing portion is joined to the leadframe, and the bonding wires used for the signal processing portion each consist of a metal wire of a different metal from said first metal through which the bonding pad in the signal processing portion is joined to the leadframe.

2. The semiconductor device of claim 1, wherein the bonding wires used for the power processing portion each consist of an aluminum wire, and the bonding wires used for the signal processing portion each consist of a gold wire.

3. The semiconductor device of claim 1, wherein the bonding wires used for the power processing portion each consist of aluminum wire, and the bonding wires used for the signal processing portion each consist of a silver wire.

4. The semiconductor device of claim 1, wherein the bonding wires used for the power processing portion each consist of an aluminum wire, and the bonding wires used for the signal processing portion each consist of a copper wire.

5. The semiconductor device of claim 1, wherein the bonding wires used for the power processing portion each consist of an aluminum wire, and the bonding wires used for the signal processing portion each consist of a palladium wire.

6. The semiconductor device of claim 1, wherein the bonding wires used for the power processing portion each consist of an aluminum alloy wire, and the bonding wires used for the signal processing portion each consist of a silver wire.

7. The semiconductor device of claim 1, wherein the bonding wires used for the power processing portion each consist of an aluminum alloy wire, and the bonding wires used for the signal processing portion each consist of a copper wire.

8. The semiconductor device of claim 1, wherein the bonding wires used for the power processing portion each consist of an aluminum alloy wire, and the bonding wires used for the signal processing portion each consist of a palladium wire.

* * * * *